United States Patent
Yanagimoto et al.

(10) Patent No.: US 8,261,437 B2
(45) Date of Patent: Sep. 11, 2012

(54) METHOD FOR MANUFACTURING A CIRCUIT BOARD

(75) Inventors: Hiroshi Yanagimoto, Seto (JP); Takeshi Bessho, Toyota (JP); Hidemi Nawafune, Kobe (JP); Kensuke Akamatsu, Kobe (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 514 days.

(21) Appl. No.: 12/525,967

(22) PCT Filed: Feb. 27, 2008

(86) PCT No.: PCT/JP2008/053900
§ 371 (c)(1),
(2), (4) Date: Aug. 5, 2009

(87) PCT Pub. No.: WO2008/105561
PCT Pub. Date: Sep. 4, 2008

(65) Prior Publication Data
US 2010/0270057 A1 Oct. 28, 2010

(30) Foreign Application Priority Data
Feb. 28, 2007 (JP) ................................. 2007-049447

(51) Int. Cl.
*H05K 3/02* (2006.01)
(52) U.S. Cl. ............... 29/846; 29/825; 29/847; 29/848; 427/96.1
(58) Field of Classification Search ............ 29/825, 29/846, 847, 848; 427/96.1
See application file for complete search history.

(56) References Cited

U.S. PATENT DOCUMENTS
4,354,895 A * 10/1982 Ellis ............................... 216/20
(Continued)

FOREIGN PATENT DOCUMENTS
JP 48-091560 A 11/1973
(Continued)

OTHER PUBLICATIONS
Tomomi Aoki, et al., "Fabrication of Copper Minute Wiring on Polymide Film Using Site-Selective Surface Modification," #17 Microelectronics Symposium, Sep. 2007, pp. 175-178.

(Continued)

*Primary Examiner* — Carl Arbes
(74) *Attorney, Agent, or Firm* — Sughrue Mion, PLLC

(57) ABSTRACT

According to the present invention, a circuit board having a further-microfabricated circuit pattern that can be manufactured in further simplified steps is obtained. For such purpose, a mold 10, which has protrusions 11 formed in a pattern corresponding to a circuit pattern, is used to apply a conductive material layer (metal paste) 13 to head portions of the protrusions 11 of the mold 10. The mold is heat- and pressure-welded to the surface of a substrate 20 that is made of a resin film or the like. Accordingly, a pattern comprising the protrusions 11 and the conductive material layer (metal paste) 13 are transferred to the substrate 20. After transfer, the resin substrate (resin molding 30) is immersed in a copper sulfate plating bath for electrolytic plating treatment. Copper ions in the plating bath were deposited inside each recess 31 while the conductive material layer 13 is used as a base material for the formation of a metal wiring 32.
A pattern of the recesses 31 transferred to the substrate-20 side is determined depending on a pattern comprising the protrusions 11 on the mold 10. Thus, a microfabricated high-density circuit pattern formed with metal wirings 32 having arbitrary aspect ratios can be obtained.

5 Claims, 2 Drawing Sheets

U.S. PATENT DOCUMENTS

2002/0119251 A1     8/2002     Chen et al.
2004/0187310 A1     9/2004     Gurumurthy

FOREIGN PATENT DOCUMENTS

| | | |
|---|---|---|
| JP | 52-130719 A | 11/1977 |
| JP | 54-121811 A | 9/1979 |
| JP | 60-164392 A | 8/1985 |
| JP | 60-502233 T | 12/1985 |
| JP | 5-129759 A | 5/1993 |
| JP | 2000-124581 A | 4/2000 |
| JP | 2001-1287473 A | 10/2001 |
| JP | 2002184752 | 6/2002 |
| JP | 2004-95882 A | 3/2004 |
| JP | 2004-270021 A | 9/2004 |
| JP | 2005-029735 A | 2/2005 |
| JP | 2005-064289 A | 3/2005 |
| JP | 2005-340432 A | 12/2005 |
| JP | 2006-066626 A | 3/2006 |
| JP | 2006-188054 A | 7/2006 |
| JP | 2006-339365 A | 12/2006 |
| JP | 2007-110092 A | 4/2007 |

OTHER PUBLICATIONS

Tomomi Aoki, et al., "Formation of fine copper damascene wiring on polymide resin via surface modification," Abstracts of the 115th Meeting of the Surface Finishing Society of Japan, Mar. 2007, pp. 66-67.

Tomomi Aoki, et al., "Formation of fine copper damascene wiring on polymide resin," Abstracts of the 116th Meeting of the Surface Finishing Society of Japan, Sep. 2007, pp. 301-302.

German Office Action dated Apr. 12, 2011, issued in corresponding German Patent Application No. 11 2008 000 485.4-34.

Office Action issued in corresponding Korean Patent Application No. 10-2009-7020018, dated Jan. 25, 2011.

Japanese Office Action corresponding to Japanese Patent Application No. 2007-049447 dated Jun. 8, 2010.

\* cited by examiner

METHOD FOR MANUFACTURING A CIRCUIT BOARD

TECHNICAL FIELD

The present invention relates to a circuit board and a method for manufacturing the same. In particular, the present invention relates to a circuit board comprising a thin-film substrate that is formed with a resin material and the like and has the surface on which metal wirings are formed in a desired pattern, and it also relates to a method for manufacturing the same.

BACKGROUND ART

Dry processes involving vacuum evaporation, sputtering, and the like are known as methods for forming a microfabricated circuit pattern on the surface of a thin-film resin substrate. In addition, a subtractive method has been widely used, such method comprising: coating the entire surface of a substrate comprising, for example, a polyimide resin with a metal film comprising, for example, copper foil so as to produce a metal coating material; and removing unnecessary metal film portions by an etching treatment involving photolithography or the like. However, in the case of such subtractive method, it is difficult to form a microfabricated wiring with a width of approximately 30 µm or less. Therefore, further technology innovation has been awaited for the manufacturing of next-generation high-density circuit substrates.

In response to such demand, Patent Document 1 discloses a method for manufacturing metal wiring on a polyimide film. In the method, a chemical that can dissolve polyimide is applied to selected portions on a polyimide film with the use of a lithography apparatus or the like such that selective etching is carried out for recess formation. At such time, remaining polyimide portions on the film surface are modified so as to be able to adsorb metal ions. Subsequently, a metal-ion-containing solution and the polyimide portions come into contact with each other so that metal ions are exclusively adsorbed to the modified portions. Then, a metal-ion-reducing agent is allowed to come into contact with the metal ions such that metal (oxide) nanoparticle assemblies are deposited in polyimide recesses formed by etching described above. At the end, electroless or electrolytic plating treatment is carried out such that a metal film is deposited in each recess, resulting in formation of a microfabricated circuit. The document describes that the method allows low-cost production of a wiring that is microfabricated to a greater extent than that obtained by a conventional subtractive method.

[Patent Document 1] JP Patent Publication (Kokai) No. 2005-29735 A

DISCLOSURE OF THE INVENTION

Problem to be Solved by the Invention

In the above method, recesses for wirings are formed on the surface of a polyimide film serving as a substrate by chemical etching. In such case, etching is carried out in an isotropic manner. Therefore, when the necessary wiring film thickness is as thin as 10 µm or less, it can be expected that a microfabricated circuit pattern will be formed. However, when a large degree of wiring film thickness is necessary, formation of recesses with large widths is unavoidable. As a result, it becomes difficult to achieve microfabrication and high-density formation of wirings. It is also difficult to form wirings with aspect ratios of 1 or more. This also makes it difficult to achieve microfabrication of wirings. Further, in the above case, chemicals are applied to a polyimide film in a sequential manner, resulting in an increase in the number of treatment steps and leading to an unavoidable increase in cost.

The present invention has been made in view of the above problems. It is an objective of the present invention to provide a novel manufacturing method comprising manufacturing a circuit board having a further-microfabricated circuit pattern in further simplified steps. It is another objective of the present invention to provide a novel circuit board obtained by the above manufacturing method.

Means for Solving Problem

The method for manufacturing a circuit board comprising a substrate having a surface on which desired metal wirings are formed according to the present invention comprises at least the steps of: using a mold, which has protrusions formed on one surface thereof in a pattern corresponding to a circuit pattern, and applying a conductive material layer to head portions of the protrusions of the mold; pressure-welding the mold, which has the protrusions with the head portions to which the conductive material layer has been applied, to the surface of the substrate and transferring a pattern comprising the protrusions and the conductive material layer to the surface of the substrate; and forming metal wirings in recesses that are formed in the previous step of transferring the pattern with the use of the transferred conductive material layer as a base material.

In the above manufacturing method, the protrusion pattern formed on the mold is directly transferred to the substrate side, and thus a recess with an arbitrary aspect ratio (i.e., the ratio of depth to width) can be formed on the substrate surface. As a result, a recess pattern that is microfabricated at a higher density can be formed on the substrate surface. In addition, pressure welding of the mold to the substrate surface results in simultaneous transfer of the protrusion pattern to the substrate surface and of a conductive material layer to the bottom face of each formed recess. Therefore, manufacturing processes can be simplified. Further, such pressure welding results in stable conditions of transferring of the conductive material layer to the substrate side.

A conductive material layer that is transferred to the bottom portion of each recess formed on a substrate is used as a base material to form a metal wiring in each recess. Thus, the circuit board of the present invention is obtained. As described above, the recess pattern formed on the substrate surface is microfabricated at a high density, and thus a circuit board with a high wiring density can be obtained. In the case of the circuit board of the present invention, the high-current flow through wiring portions can be resolved by determining a pattern comprising wirings with high aspect ratios. Thus, even when the circuit pattern is microfabricated (high-density formation), the circuit board of the present invention is not impaired in terms of insulating reliability when used as a mounting board.

In the method for manufacturing a circuit board of the present invention, examples of materials constituting the conductive material layer, which can be used include, but are not limited to, a metal paste comprising a mixture of inorganic metal particles and a solvent and a resinate paste comprising a mixture of an organic metal compound and a solvent. A metal paste is not limited; however, a copper paste, which is a low-resistance material, is particularly preferable. In addition to the above, a silver paste, a gold paste, a nickel paste, and the like can be used. In such case, the particle sizes of metal particles are preferably approximately several to several hundreds of nanometers. Examples of a resinate paste include a copper resinate, a silver resinate, a gold resinate, and a nickel resinate. In the case of a metal paste, transfer to the substrate is carried out via heat and pressure welding. Accordingly, sintering treatment of metal particles proceeds, and thus a metal film is obtained. Some portions of the film are embedded to the substrate side, indicating that transfer of the metal film to the substrate side securely proceeds. The sintering temperature can be determined depending on the material used for the substrate; however, it is preferably 100° C. to 500° C.

In the method for manufacturing a circuit board of the present invention, an arbitrary material can be used as a material for a mold, provided that protrusions can be formed on the mold and the mold is resistant to mechanical and thermal stresses when transferred to the substrate side. Preferred examples of a material that can be used include glass, silicon, quartz, stainless steel, resins, and metals. Examples of a metal material include: nickel and alloys thereof; and stainless steel. However, in view of durability and positional precision, nickel and alloys thereof are particularly preferable.

In order to form protrusions in a pattern corresponding to a circuit pattern on the surface of the mold, conventionally known methods such as microetching, electrocasting, and microcontact printing can be used. An appropriate method is used depending on a material to be used. Among such methods, microcontact printing is preferable. The use of such method allows formation of a protrusion (circuit) pattern with a protrusion width of 30 μm or less, for example.

The widths and the heights of protrusions to be formed on a mold and the interval between each of the two protrusions are determined depending on the circuit pattern required for a circuit board to be obtained. In one example, the protrusion width is approximately 5 μm to 300 μm, the protrusion height is approximately 5 μm to 500 μm, and the interval between each of the two protrusions is approximately 5 μm to 300 μm identical width and an identical height may be applied to all protrusions, or some protrusions may have different widths and heights.

In the method for manufacturing a circuit board of the present invention, an arbitrary material can be used for a substrate as long as it is a nonconductive material. Materials conventionally used for such kind of circuit board can be used in an appropriate manner. Such a material is preferably a thin film with a thickness of approximately 10 μm to 1000 μm. In view of the ease of transfer and maintenance of a pattern comprising recesses formed by transfer, a thermoplastic resin or a thermosetting resin is particularly preferable. Examples of such resin include polypropylene-based resins, polystyrene-based resins, polyethylene-based resins, polyacrylonitrile, vinyl chloride, polycarbonate, polyethylene terephthalate, polytetrafluoroethylene, polyether ether ketone, polyethylene naphthalate, and polyamide acid resins that are polyimide precursors. Of these, polyamide resins having high thermal, mechanical, and chemical properties are preferable.

In the method for manufacturing a circuit board of the present invention, a specific example of the step of forming metal wirings with the use of the transferred conductive material layer as a base material is a step of causing deposition of a metal film in each recess with the use of the conductive material layer as a core via a known electroless or electrolytic plating treatment. When an electrolytic plating treatment is performed, the above transferred conductive material layer functions as a seed layer. When an electroless plating treatment is performed, the above transferred conductive material layer functions as a plating catalyst core. Electroless plating is preferably used for formation of a wiring with a thin film thickness (e.g., approximately 50 μm or less). Electrolytic plating is preferably used for formation of a wiring with a thicker film thickness than in the above case.

According to the present invention, another example of a circuit board manufactured by the above manufacturing method is also disclosed. Such circuit board is characterized in that recesses are formed on the surface of a substrate in a pattern corresponding to a circuit pattern, that a conductive material layer is formed in the bottom face of each recess, and that metal wiring is formed in each recess as a result of deposition of a metal film with the use of the conductive material layer as a core via an electroless or electrolytic plating treatment.

In the above circuit board, some metal wirings may have aspect ratios that differ from those of the others, or all metal wirings may have identical aspect ratios. A metal wiring with an aspect ratio of 1 or more may be contained in the circuit board.

In the case of the above circuit board, the metal wiring width is approximately 5 μm to 300 μm, the metal wiring height is approximately 5 μm to 500 μm, and the metal wiring interval is approximately 5 μm to 300 μm, although there is no limitation. The circuit board preferably comprises a resin film. The film thickness is, but is not limited to, approximately 10 μm to 1000 μm. A material for a substrate and a material used as a conductive material are as described above in relation to the manufacturing method.

The circuit board of the present invention is a high-density mounting board with excellent reliability, and thus it can be effectively used as an interposer, a rigid-flexible circuit board, and the like.

According to the present invention, it becomes possible to manufacture a circuit board having a further-microfabricated circuit pattern in further simplified steps.

EXPLANATION OF REFERENCE NUMERALS

10: mold; 11: protrusion; 13: conductive material layer (metal paste); 20: substrate; 30: resin molding; 31: recess; 32: metal wiring; and 35: circuit board

BEST MODE FOR CARRYING OUT THE INVENTION

The present invention is hereafter described in greater detail in the following embodiments with reference to the drawings. However, it is obviously understood that the technical scope of the present invention is not limited to the embodiments.

(Embodiment 1)

Figure 1:
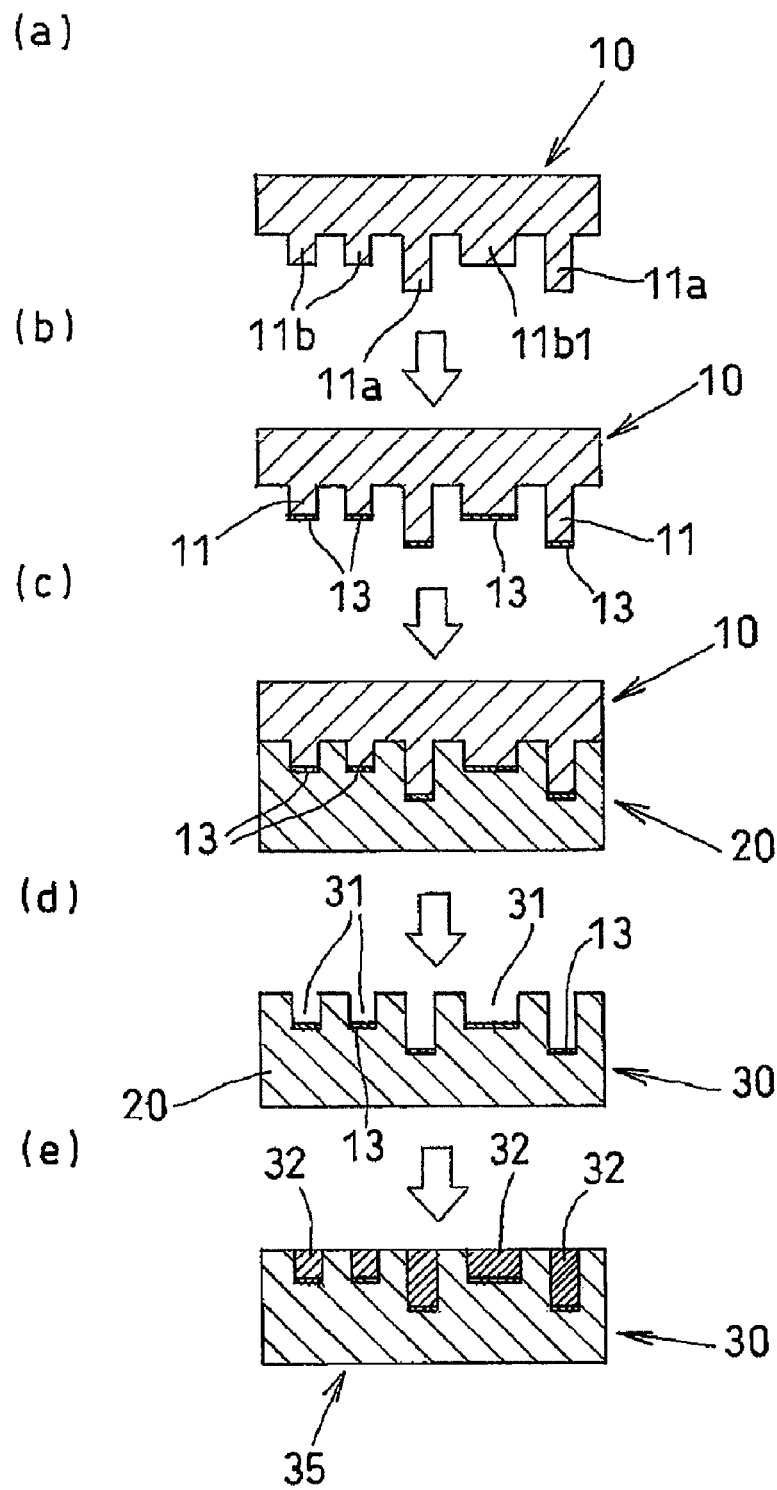
FIG. 1 shows an embodiment of the method for manufacturing a circuit board of the present invention in the order of manufacturing steps.

FIG. 1 shows a first embodiment of the method for manufacturing a circuit board of the present invention in the order of manufacturing steps. In FIG. 1, a numerical reference "10" denotes a mold. Protrusions 11 were formed on the flat face side of a nickel alloy plate having at least one flat face by a conventionally known electrocasting treatment such that they were formed in a pattern corresponding to a circuit pattern to be formed on the surface of a circuit board to be obtained. In the case of a mold 10 shown in FIG. 1a, protrusions 11a and 11b having different heights were formed in a manner such that a protrusion 11b1 has a greater width than the widths of the other protrusions 11b.

The widths of protrusions 11a and 11b were each determined to be 5 μm. The width of a protrusion 11b1 was determined to be 20 μm. The interval between each of the two protrusions was determined to be 5 μm. The heights of protrusions 11a and 11b were determined to be 15 μm and 5 μm, respectively.

Next, as shown in FIG. 1b, a copper paste mainly consisting of copper nanoparticles with an average particle size of 10 nm was applied to a thickness of approximately 3 μm to the head portions of the protrusions 11 of the obtained mold 10. Thus, a conductive material layer 13 was obtained.

Then, as shown in FIG. 1c, a polyamide acid resin film 20 with a thickness of 50 μm was placed on a flat glass plate (not shown) serving as a base. The above mold 10 was heat- and pressure-bonded to the surface of the film with the use of a microcontact printing apparatus at 400° C. for 20 minutes in a vacuum environment, such mold having the protrusions 11 with the head portions to which a conductive material layer 13 comprising a metal paste had been applied. As a result of heat and pressure bonding, the protrusions 11 of the mold 10 were transferred to the surface of a substrate 20 such that recesses 31 were formed thereon. During such process, sintering of copper nanoparticles contained in the copper paste proceeded, and thus the particles were formed into a continuous copper thin film so as to be transferred to the bottom face of each recess 31.

The thus transferred conductive material layer (copper thin film) 13 was embedded in separate portions on the substrate-20 side by pressure welding. In addition, since the process was carried out in a vacuum environment, solvent removal from the copper paste was promoted.

The mold 10 was removed from the glass plate at ordinary temperatures and pressures. Accordingly, as shown in FIG. 1d, a resin molding 30 was obtained, such molding having recesses 31 formed on the surface thereof, and such recesses having bottom portions to which the conductive material layer 13 made of a copper thin film had been transferred.

The resin molding 30 was immersed in a copper sulfate plating bath for electrolytic plating treatment for approximately 20 minutes. During such process, copper ions in the plating bath were deposited inside each recess 31 while the conductive material layer 13 was used as a core for such deposition. Accordingly, a desired copper wiring 32 was formed inside each recess 31 by filling. At the end, metal portions that had been formed outside the recesses were removed by polishing. Thus, the circuit board 35 of the present invention was finished.

(Embodiment 2)

Figure 2:
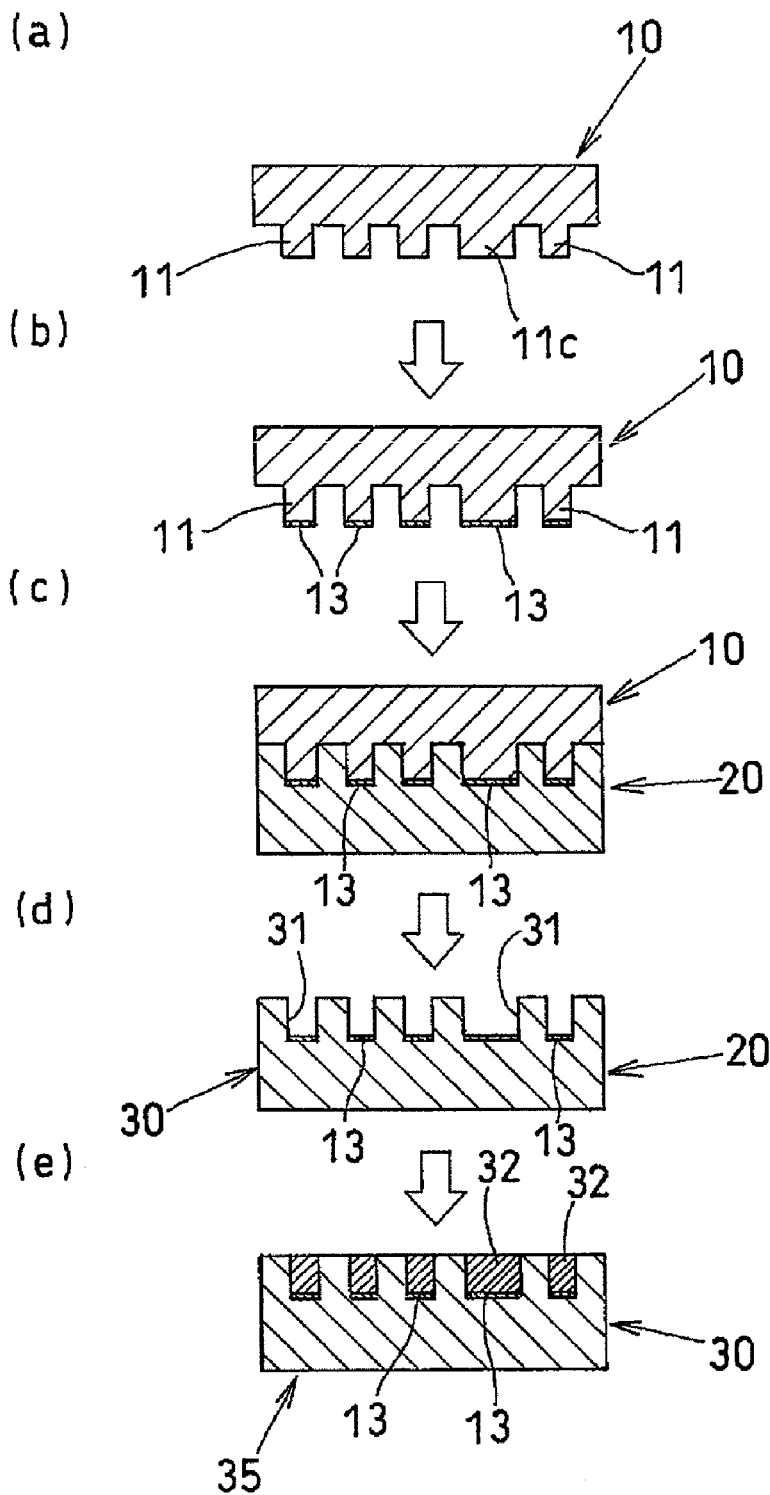
FIG. 2 shows another embodiment of the method for manufacturing a circuit board of the present invention in the order of manufacturing steps.

FIG. 2 shows a second embodiment of the method for manufacturing a circuit board of the present invention in the order of manufacturing steps. Herein, a glass plate having one flat face was used as a material for a mold 10 and a conventionally known sandblasting treatment was performed on the flat face side of the glass plate. Accordingly, protrusions 11 were formed as shown in FIG. 2a. The width and the height of each protrusion 11 were determined to be 5 μm and 10 μm, respectively, except that the width of a protrusion 11c was determined to be 10 μm. In addition, the interval between each of the two protrusions was determined to be 5 μm.

Next, a silver paste mainly consisting of silver nanoparticles with an average particle size of 20 nm was stretched and applied to a thickness of 2 μm to the surface of a PET plate with the use of a bar coater or the like. The protrusion-11 side of a mold 10 was pressed thereto. Accordingly, as shown in FIG. 2b, a mold 10 was obtained, such mold having the protrusions 11 with the head portions to which the silver paste 13 had been applied.

For preparation, polyamide acid to be formed into a substrate 20 was stretched and applied to a thickness of 30 μm to the surface of a flat glass plate (not shown) with the use of a bar coater or the like. Then, as shown in FIG. 2c, the protrusion-11 side of a mold 10 was pressed thereto, followed by heat treatment in vacuo at 350° C. for 20 minutes.

The mold 10 was removed from the glass plate at ordinary temperatures and pressures. As shown in FIG. 2d, a resin molding 30 was obtained, such molding comprising the above polyimidized substrate 20 on the surface of which a pattern comprising protrusions 11 of the mold 10 was transferred to form recesses 31. A continuous silver thin film, which was obtained as a result of sintering of copper nanoparticles contained in the silver paste, was transferred to the bottom portion of each of the recesses 31 formed above by transfer so that the film could serve as a conductive material layer (copper thin film) 13. In addition, since the process was carried out in a vacuum environment, solvent removal from the silver paste was promoted.

The resin molding 30 was immersed in a copper sulfate plating bath for electrolytic plating treatment for 20 minutes. During such process, copper ions in the plating bath were deposited inside each recess 31 while the conductive material layer 13 was used as a core for such deposition. Accordingly, a desired copper wiring 32 was formed inside each recess 31 by filling. Thus, the circuit board 35 of the present invention was finished.

(Embodiment 3)

Protrusions each having a width of 50 μm and a height of 50 μm were formed with the use of a quartz plate having one flat face (not shown) as a material for a mold 10 in the same manner as in Embodiment 2. The interval between each of the two protrusions was determined to be 10 μm.

Next, a silver paste mainly consisting of silver nanoparticles with an average particle size of 5 nm was stretched and applied to a thickness of 5 μm to the surface of a PET plate with the use of a bar coater or the like. The protrusion-11 side of the mold 10 was pressed thereto. Accordingly, a mold 10 was obtained, such mold having the protrusions 11 with head portions to which the silver paste 13 had been applied.

A polycarbonate resin film with a thickness of 80 μm was placed on a glass plate. Then, the protrusion-11 side of the mold 10 was pressed thereto, followed by heat treatment in vacuo at 170° C. for 10 minutes.

The mold 10 was removed from the glass plate at ordinary temperatures and pressures. Accordingly, a resin molding 30 was obtained, such molding comprising a substrate 20 (made of a polycarbonate resin film) on the surface of which a pattern comprising the protrusions 11 of the mold 10 was transferred to form recesses 31. A continuous silver thin film with a thickness of 2 μm, which was obtained as a result of sintering of copper nanoparticles contained in the silver paste, was transferred to the bottom portion of each recess 31 formed above by transfer so that the film could serve as a conductive material layer (copper thin film) 13. In addition, since the process was carried out in a vacuum environment, solvent removal from the silver paste was promoted.

As in the case of Embodiment 2, the resin molding 30 was immersed in a copper sulfate plating bath for electrolytic plating treatment for 20 minutes. During such process, copper ions in the plating bath were deposited inside each recess 31 while the conductive material layer 13 was used as a core for such deposition. Accordingly, a desired copper wiring 32 was formed inside each recess 31 by filling. Thus, the circuit board 35 of the present invention was finished.

In the case of the circuit board 35 of the present invention, examples of which are shown in Embodiments 1, 2, and 3 above, recesses 31 are formed on the substrate-20 side in a pattern corresponding to a pattern comprising protrusions 11 formed on a mold 10. Therefore, depending on the heights of protrusions 11 to be formed, arbitrary aspect ratios can be determined for metal wirings 32 to be formed in recesses 31. A metal wiring with a high aspect ratio is provided to a portion with a high current density. This allows a reduction in the interval between two neighboring metal wirings while high-insulating properties are maintained. Accordingly, a circuit board 35 having a microfabricated high-density circuit pattern can readily be formed. Also, manufacturing requires only pressure bonding of a mold and plating treatment and thus can be achieved with fewer steps.

Depending on the widths and the depths of the above recesses 31, the thickness of a metal film formed in each recess after the elapse of a certain period of time would vary. Therefore, metal deposition to a thickness exceeding the surface height of the substrate 20 might take place in some recesses 31 while metal film formation to a desired thickness would not be achieved in some of the other recesses 31. Even in such case, a short-circuit-free high-density circuit board can be obtained by means of polishing the substrate surface in the final step, for example.

Such a circuit board can be obtained not only via electrolytic plating treatment but also via electroless plating treatment. Also, for electroless plating treatment, a conductive material layer similar to that used for electrolytic plating can be used.

The invention claimed is:

1. A method for manufacturing a circuit board comprising a substrate having a surface on which desired metal wirings are formed, comprising at least the steps of:
    using a mold, which has protrusions formed on one surface thereof in a pattern corresponding to a circuit pattern, and applying a conductive material layer to head portions of the protrusions of the mold;
    pressure-welding the mold, which has the protrusions with the head portions to which the conductive material layer has been applied, to the surface of the substrate and transferring a pattern comprising the protrusions and the conductive material layer to the surface of the substrate so that recesses are formed in the substrate, the conductive metal material layer being provided at bottoms of the recesses; and
    forming metal wirings in the recesses on the transferred conductive material layer.

2. The method for manufacturing a circuit board according to claim 1, wherein a metal paste or a resinate paste is used a material constituting the conductive material layer.

3. The method for manufacturing a circuit board according to claim 1, wherein glass, silicon, quartz, stainless steel, a resin, or a metal is used as a material for the mold.

4. The method for manufacturing a circuit board according to claim 1, wherein a resin material is used as a material for the substrate.

5. The method for manufacturing a circuit board according to claim 1, wherein the step of forming metal wirings with the use of the transferred conductive material layer as a base material is carried out by causing deposition of a metal film in each recess with the use of the conductive material layer as a core via a known electroless or electrolytic plating treatment.

* * * * *